United States Patent [19]
Kodai et al.

[11] Patent Number: 5,244,840
[45] Date of Patent: Sep. 14, 1993

[54] METHOD FOR MANUFACTURING AN ENCAPSULATED IC CARD HAVING A MOLDED FRAME AND A CIRCUIT BOARD

[75] Inventors: Shojiro Kodai; Katsunori Ochi, both of Itami; Fumiaki Baba, Amagasaki, all of Japan

[73] Assignee: Mitsubishi Denki Kabushiki Kaisha, Tokyo, Japan

[21] Appl. No.: 963,699

[22] Filed: Oct. 20, 1992

Related U.S. Application Data

[62] Division of Ser. No. 526,849, May 22, 1990, Pat. No. 5,184,209.

[30] Foreign Application Priority Data

May 23, 1989 [JP] Japan ................................. 1-129302

[51] Int. Cl.$^5$ .................... H01L 21/52; H01L 21/54; H01L 21/56; H01L 21/58
[52] U.S. Cl. ............................... 437/214; 437/219; 235/492; 257/679
[58] Field of Search ................ 437/214, 219, 205; 235/492; 361/399; 257/667, 679, 687

[56] References Cited

U.S. PATENT DOCUMENTS

| | | | |
|---|---|---|---|
| 4,004,133 | 1/1977 | Hannan et al. | 235/61.7 B |
| 4,550,248 | 10/1985 | Hoppe et al. | 235/492 |
| 4,569,000 | 2/1986 | Noji | 361/399 |
| 4,609,970 | 9/1986 | Hilpert | 361/399 |
| 4,611,262 | 9/1986 | Galloway et al. | 235/492 |
| 4,695,925 | 9/1987 | Kodai et al. | 361/395 |
| 4,709,254 | 11/1987 | Haghiri-Tehrani et al. | 257/679 |
| 4,758,689 | 7/1988 | Nakao et al. | 174/52 S |
| 4,780,791 | 10/1988 | Morita et al. | 361/395 |
| 4,822,988 | 4/1989 | Gloton | 235/492 |
| 4,961,105 | 10/1990 | Yamamoto | 257/679 |
| 4,962,415 | 10/1990 | Yamamoto et al. | 357/74 |
| 4,974,120 | 11/1990 | Kodai et al. | 361/392 |
| 4,996,411 | 2/1991 | Rebjock | 235/488 |
| 5,079,673 | 1/1992 | Kodai et al. | 361/400 |

FOREIGN PATENT DOCUMENTS

| | | |
|---|---|---|
| 2609820 | 7/1988 | France . |
| 59-72183 | 4/1984 | Japan . |
| 60-150659 | 8/1985 | Japan . |
| 60-189587 | 9/1985 | Japan . |
| 60-217492 | 10/1985 | Japan . |
| 61-222712 | 10/1986 | Japan . |
| 63-239097 | 10/1988 | Japan . |
| 2-24197 | 1/1990 | Japan . |

*Primary Examiner*—Olik Chaudhuri
*Assistant Examiner*—David E. Graybill
*Attorney, Agent, or Firm*—Leydig, Voit & Mayer

[57] ABSTRACT

A method for manufacturing an integrated circuit card by providing a circuit board having electronic components mounted thereon intermediate the thickness of a molded frame and filling the frame with resin in a mold so that the resin passes through an opening in the circuit board and seals both sides of the board to a thickness no greater than the frame thickness.

2 Claims, 6 Drawing Sheets

METHOD FOR MANUFACTURING AN ENCAPSULATED IC CARD HAVING A MOLDED FRAME AND A CIRCUIT BOARD

This application is a division of application Ser. No. 07/526,849, filed May 22, 1990. Now U.S. Pat. No. 5,184,209.

BACKGROUND OF THE INVENTION

1. Field of the Invention

The present invention relates to an IC card and a manufacturing method therefor, the IC card being formed in such a manner that a circuit board portion, on which electronic parts having various functions are mounted, is sealed in a frame with a molding resin sealant.

2. Description of the Related Art

FIGS. 1A and 1B are a plan view and a front elevational cross sectional view each of which illustrates a conventional IC card of a non-contact type having no electrode terminal for establishing an external connection. A circuit 3 is formed on one of the main surfaces of a circuit board 2 made of, for example, epoxy glass. Furthermore, electronic parts such as ICs (Integrated Circuits) 1 and communication means (for example, a transmitting/receiving coil) (omitted from the illustration) are mounted on the same main surface of the circuit board 2. The thus arranged circuit board 2 is adhered within a lower case 4a by using an adhesive, or the circuit board 2 and the lower case 4a are joined by ultrasonic welding. Then, an upper case 4b is adhered onto the lower case 4a by using an adhesive so that an outer case 4 is formed. Thus, a thin IC card is manufactured.

FIGS. 2A and 2B are a front elevational cross sectional view and a bottom view of another conventional IC card of a contact type arranged in such a manner that electrode terminals for establishing an external connection appear on the surface thereof. A projecting terminal frame 2a is integrally formed with one of the surfaces of the circuit board 2 or fastened to the same by bonding. A circuit 3 is formed on the surface of the circuit board 2. A plurality of electrode terminals 5, are formed on the outer surface of the terminal frame 2a, the plurality of electrode terminals 5 being connected to the above-described circuit 3 via through holes 6. The lower case 4a has an opening through which the terminal frame 2a is introduced so as to be engaged thereto. Thus, the circuit board 2 is bonded onto the inside of the lower case 4a so that the electrode terminals 5 appear outside on the surface of the IC card. The upper case 4b is bonded onto the lower case 4a so that the outer case 4 is formed. Thus, the IC card is manufactured.

The conventional IC cards of the above-described types are arranged in such a manner that the thickness of each of the upper and the lower plates of the outer case 4 and the gap between the components mounted on the circuit board 2 are reduced in order to reduce the overall thickness of the IC card. Therefore, a problem arises in that the IC card can be easily deformed by external pressure, causing the electronic parts to be subjected to undesirable effects. Another problem arises in that it is difficult to secure the circuit substrate 2 to the lower case 4a and to join the upper case 4b to the lower case 4a with an airtight seal between the periphery of the terminal frame 2a and the opening formed in the lower case 4a (if there is a gap, water can enter therethrough). What is even worse, the upper case 4b and the lower case 4a which have been bonded to each other can be undesirably separated from each other. In order to prevent the deformation of the IC card due to external pressure, means for injecting synthetic resin into the space in the outer case 4 must be provided.

SUMMARY OF THE INVENTION

Accordingly, an object of the present invention is to provide a reliable, thin and compact IC card and a manufacturing method therefor in which a circuit board on which electronic parts, are reliably hermetically sealed, so that the package can be easily formed and deformation due to external force can be prevented.

In order to achieve the above-described object, according to the present invention, there is provided an IC card accommodating electronic parts and having a certain thickness, comprising: a frame made of molded synthetic resin and having a periphery having a width corresponding to the thickness of the IC card and a circuit board integrally formed with the periphery and disposed at an intermediate position in the direction of the thickness at the inner side of the periphery, the circuit board having main surfaces; electric circuit means having a circuit formed on at least one of the main surfaces of the circuit board, at least one electronic part electrically connected to the circuit and mounted on the at least one of main surfaces of the circuit board and an I/O portion disposed on the surface of either of the circuit board or the periphery, the I/O portion acting to supply/receive information to and from external equipment; a resin sealant hermetically sealing the main portion of the electric circuit means and having a thickness in a range from the thickness of the periphery to a thickness which is slightly smaller than the same, the resin sealant being injected into the frame so as to make the whole body a card-like shape; and means for forming an opening in the circuit board so that the resin sealant is moved from one of the main surfaces of the circuit board to another main surface of the same when the resin sealant is injected into the frame.

Another aspect of the present invention lies in an IC card accommodating electronic parts and having a certain thickness, comprising: a frame made of molded synthetic resin and having a periphery having a width corresponding to the thickness of the IC card and a board supporting portion integrally formed with the periphery and disposed at an intermediate position in the direction of the thickness at the inner side of the periphery, the board supporting portion being arranged to project inwardly along the inner surface of the periphery; a circuit board supported by the board supporting portion and having main surfaces; electric circuit means having a circuit formed on at least one of the main surfaces of the circuit board, at least one electronic part electrically connected to the circuit and mounted on at least one of the main surfaces of the circuit board and an I/O portion for supplying/receiving information to and from external equipment; a resin sealant hermetically sealing the main portion of the electric circuit means and having a thickness in a range from the thickness of the periphery to a thickness which is slightly smaller than the same, the resin sealant being injected into the frame so as to make the whole body a card-like shape; and means for forming an opening with which the resin sealant can be moved from one of the main surfaces of the circuit board to another main surface of the same when the resin sealant is injected into the frame.

Furthermore, the present invention includes methods for manufacturing the above-described IC cards.

Other and further objects, features and advantages of the invention will be described in the following description.

DESCRIPTION OF THE PREFERRED EMBODIMENTS

Figure 1A:
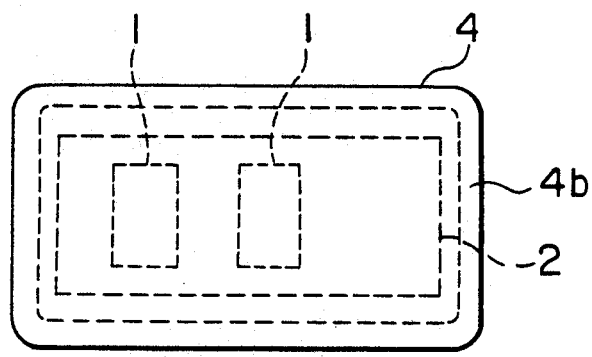
FIG. 1A is a plan view and FIG. 1B is a cross sectional view each of which illustrates a conventional non-contact type IC card.
Figure 1B:
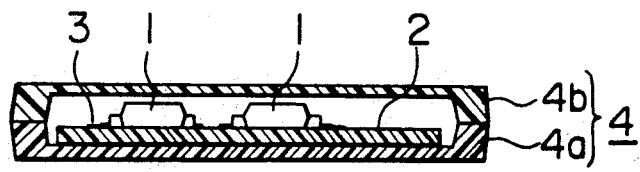
Figure 2A:
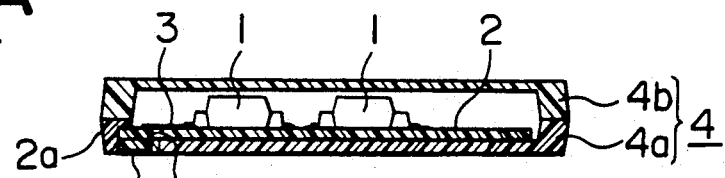
FIGS. 2A is a cross sectional view and FIG. 2B is a plan view each of which illustrates a conventional contact type IC card.
Figure 2B:
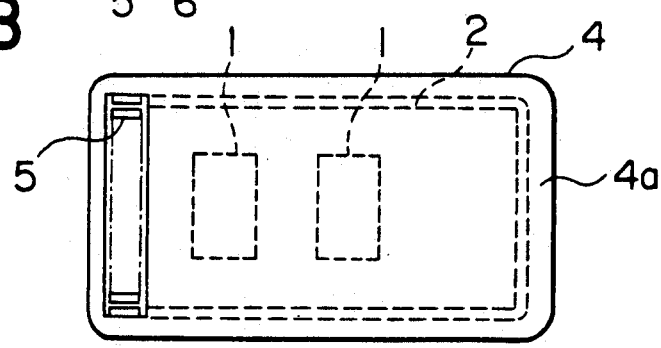
Figure 3A:
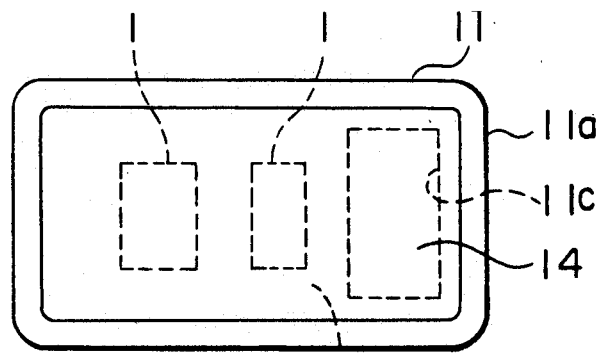
FIG. 3A is a plan view and FIG. 3B is a cross sectional view each of which illustrates a non-contact type IC card according to a first embodiment of the present invention.
Figure 3B:
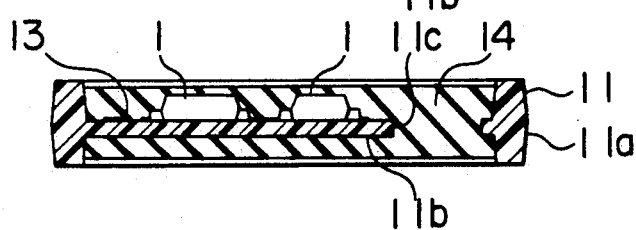
Figure 4A:
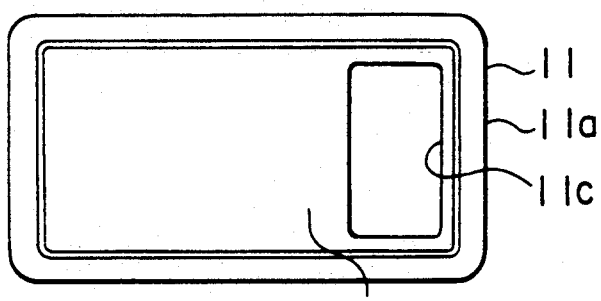
FIG. 4A is a plan view and FIG. 4B is a cross sectional view each of which illustrates the frame of the IC card shown in FIGS. 3A and 3B.
Figure 4B:
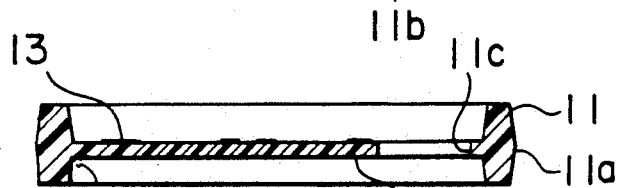

FIG. 3A is a plan view and FIG. 3B is a cross sectional view each of which illustrates an IC card according to a first embodiment of the present invention. Referring to the drawings, a frame 11 is made of a synthetic resin such as thermotropic liquid crystal polymer manufactured by injection molding, the frame 11 being arranged to be in the form of a shape as shown in FIGS. 4A and 4B. The frame 11 has a peripheral portion 11a, a circuit board 11b integrally formed at an intermediate position relative to the thickness direction of the frame 11 and an opening 11c formed therein for the purpose of communication between the two sides of the circuit board 11b.

Reference numeral 12 represents the position of a gate portion through which resin is injected into the cavity of a mold which molds the above-described frame 11. In order to cover the mark on the resin from the gate portion, the above-described position at which the gate portion is disposed is arranged at a position adjacent to the inner surface of the periphery portion 11a of the circuit board 11b.

A circuit 13 is formed on the surface of the circuit board 11b of the above-described frame 11 by electroless plating, etching means or electrolytic plating.

Referring back to FIGS. 3A and 3B, the function parts, that is the electronic parts such as ICs 1 of the IC card are mounted on the surface of the board 11 on which the circuit 13 is formed. Since this IC card is a non-contact type having no electrode terminals, communication means formed by a coil or the like, that is an I/O portion (omitted from the illustration) is also mounted on the same surface of the circuit board 11b.

Then, the frame 11 is placed in the mold and the peripheral portion 11a is fitted within the cavity (omitted from the illustration) of the mold. The thermotropic liquid crystal polymer, which is the same material as the frame 11, is used as the resin injected in the frame Thus, the electronic parts, the circuit and the I/O portion (collectively called "function parts" hereinafter) are embedded so that a resin package 14 is formed integrally with the frame 11. The surface of the resin package 14 is made flat and reaches a level which is slightly lower than the level of the two sides of the peripheral portion 11a. As a result, the introduction of the resin into the outer surfaces of the peripheral portion 11a of the frame 11 at the time of molding the resin package 14 is prevented. Furthermore, the above-described low flat surface of the resin package 14 can be used as a surface on which an illustration is written or to which a seal or a panel is bonded.

Figure 5:
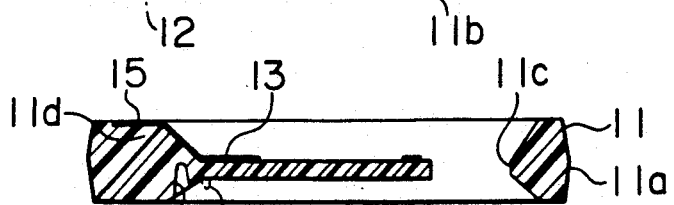
FIG. 5 is a cross sectional view which illustrates the frame of a contact type IC card according to a second embodiment of the present invention.

FIG. 5 is a cross sectional view which illustrates a second embodiment of the present invention, where a contact type IC card, the electrode terminal of which appears on the surface of the IC card, is shown. According to this embodiment, an electrode terminal 15 connected to the circuit 13 of the circuit board 11b of the frame 11 is formed on the top surface of a portion 11d of the periphery portion 11a and arranged to appear outside. At least two position reference holes 16 are formed at positions so as not to appear on the surface of the IC card and close to the portion 11d of the periphery portion 11a so as to serve as a positional reference when the circuit 13 and the electrode terminal 15 are formed, the above-described at least two position reference holes 16 being formed at the time of molding the frame 11. As a result, the electrode terminal 15 can be accurately positioned with respect to the outline of the IC card.

Figure 6:
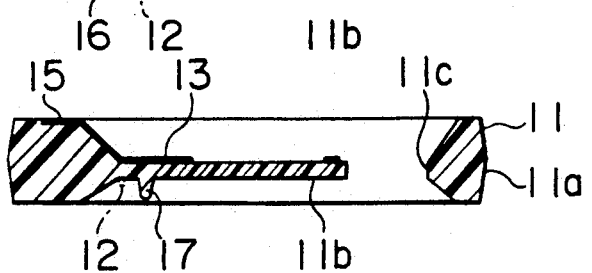
FIG. 6 is a cross sectional view which illustrates the frame of a contact type IC card according to a third embodiment of the present invention.

FIG. 6 is a cross sectional view which illustrates a frame according to a third embodiment of the present invention. In order to positionally accurately form the circuit 13 and the electrode terminal 15, at least two positioning pin portions 17 which project from the circuit board 11b are formed. The height of each of the pin portions 17 is arranged not to reach the surface of the IC card.

Figure 7A:
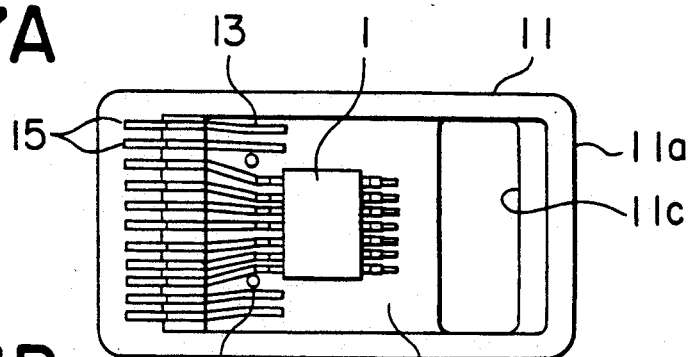
FIG. 7A is a plan view which illustrates the frame of a contact type IC card according to a fourth embodiment of the present invention in a state in which resin sealant has not been injected and FIG. 7B is a cross sectional view which illustrates a state in which the IC card has been completed.
Figure 7B:
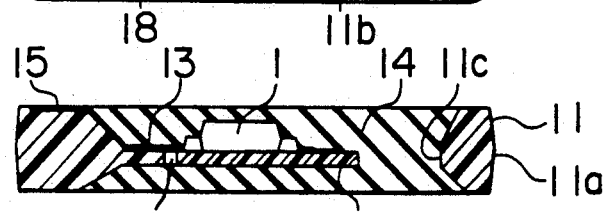

FIG. 7A is a plan view which illustrates the frame in a state where resin has not been injected so as to form the resin package of the IC card according to a fourth embodiment of the present invention. FIG. 7B is a cross sectional view which illustrates the same in a state where the IC card has been completed. According to this embodiment, at least two positioning holes 18 for positionally accurately forming the circuit 13 and the electrode terminal 15 are formed in the circuit board 11b. According to this embodiment, one IC 1 is mounted on the circuit board 11b.

Figure 8:
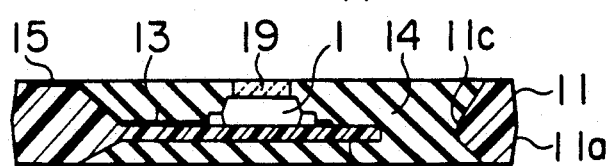
FIG. 8 is a cross sectional view which illustrates an IC card according to a fifth embodiment of the present invention.

FIG. 8 is a cross sectional view which illustrates an IC card according to a fifth embodiment of the present invention. This embodiment can be suitably applied to an IC card of the type which includes an EPROM IC 1 that must have a transparent portion. According to this embodiment, a transparent resin portion 19, made of, for example, tetramethylmonopentene (TPX) resin, is formed on the surface of the EPROM IC 1 mounted on the surface of the circuit board 11b. The top surface of the transparent resin portion 19 is arranged to appear on the surface of the IC card.

Figure 9:
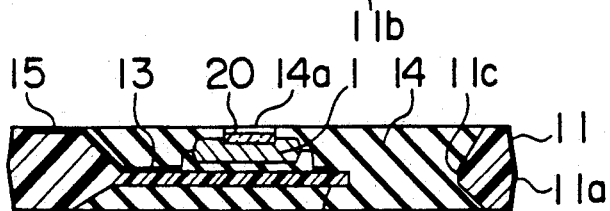
FIG. 9 is a cross sectional view which illustrates an IC card according to a sixth embodiment of the present invention.

FIG. 9 is a cross sectional view which illustrates an IC card according to a sixth embodiment of the present invention. According to this embodiment, the EPROM IC 1, which is one of the function parts mounted on the circuit board 11b, has a transparent window 20. The molded resin-package 14 has an opening 14 formed on the transparent window 20 so that the opening 14 appears outside. A seal such as an aluminum foil is applied to the opening 14a so as to prevent the transmission of ultraviolet rays into the cases except when contents of the memory of the EPROM are reloaded.

Figure 10:
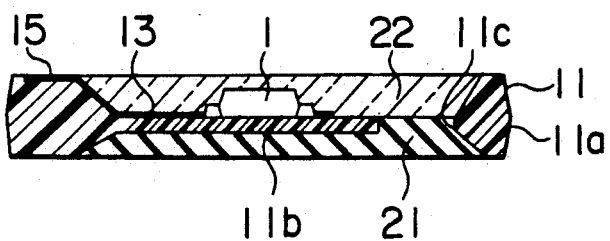
FIG. 10 is a cross sectional view which illustrates an IC card according to a seventh embodiment of present invention.

FIG. 10 is a cross sectional view which illustrates an IC card according to a seventh embodiment of the present invention. A resin package 21 made of thermotropic liquid crystal polymer is formed by molding in the lower half portion of the frame 11 in which the function parts 1 such as the ICs 1 are mounted on the circuit board 11b. On the other hand, a transparent resin package 22 made of acrylic resin or the like is formed in the upper portion of the same by molding. As a result, the function portion of the IC card can be seen through the transparent resin package 22.

According to the above-described embodiments, the circuit board 11b is integrally formed in the frame 11. Next, other embodiments in each of which an independent circuit board is supported within the frame will be described.

Figure 11A:
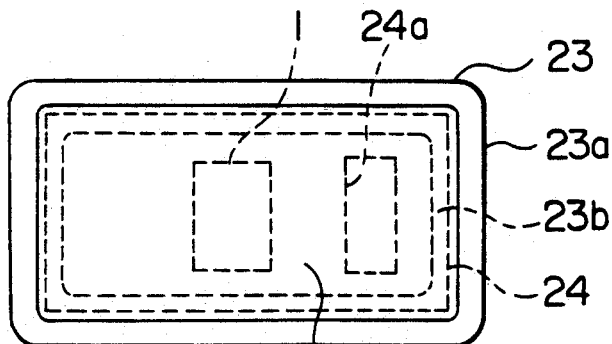
FIG. 11A is a plan view and FIG. 11B is a cross sectional view each of which illustrates a non-contact type IC card according to an eighth embodiment of the present invention.
Figure 11B:
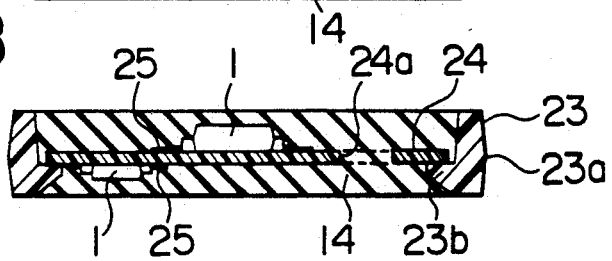
Figure 12A:
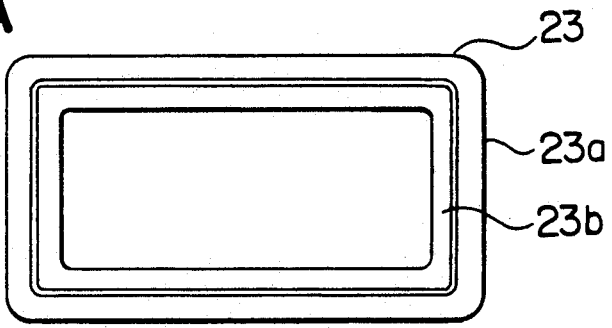
FIGS. 12A is a plan view and FIG. 12B is a cross sectional view each of which illustrates the frame of the IC card shown in FIGS. 11A and 11B.
Figure 12B:
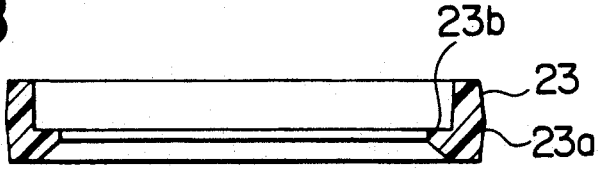

FIGS. 11A and 11B are a plan view and a cross sectional view which respectively illustrate an IC card according to an eighth embodiment of the present invention. Referring to the drawings, a frame 23 is manufactured by injecting, for example, thermotropic liquid crystal polymer, the frame 23 being arranged to be in the form of a shape as shown in FIGS. 12A and 12B. That is, the frame 23 has a peripheral portion 23a and a board supporting portion 23b projecting inwards over the periphery portion 23a, the board supporting portion 23b being disposed in the intermediate position in the direction of the thickness of the peripheral portion 23a.

Referring back to FIGS. 11A and 11B, a circuit 25 is formed on the main surface of the circuit board 24 supported on the board supporting portion 23b in the frame 23. In addition, the ICs 1 and other function parts are mounted on the same surface of the circuit board 23. Since this IC card is a non-contact type having no electrode terminal, communication means formed by a coil or the like, that is the I/O portion (omitted from illustration) is also mounted on the same surface of the circuit board 23. The circuit board 24 has an opening 24a for the purpose of introducing injected resin.

Then, the frame 23 is placed in the mold and a peripheral portion 24a is fitted within the cavity (omitted from the illustration) of the mold. The thermotropic liquid crystal polymer, which is the same material as the frame 23, is used as the resin to be injected in the frame 23. Thus, the circuit board 24 is embedded in the frame 23 so that the resin package 14 is formed integrally with the frame 23. The two sides of the resin package 14 have the same level as the two sides of the peripheral portion 23a or are slightly lower with respect to the same.

Figure 13:
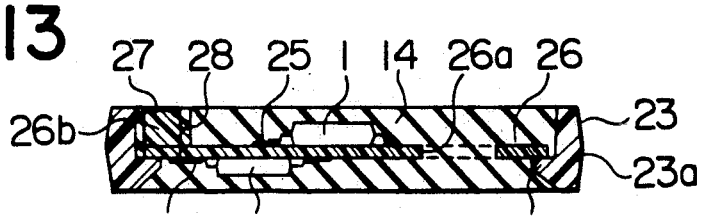
FIG. 13 is a cross sectional view which illustrates a contact type IC card according to a ninth embodiment of present invention.

FIG. 13 is a cross sectional view which illustrates an IC card according to a ninth embodiment of the present invention where a so-called contact type IC card, the electrode terminal of which appears outside, is shown. The circuit substrate 26 has circuits 25 formed on two sides thereof and an opening 26a formed therein. A terminal frame 26b is integrally formed or bonded to an end portion of the circuit board 26. The terminal frame 26b has, on the outer surface thereof, a plurality of electrode terminals 27 which appear outside. The electrode terminals 27 are connected to the corresponding circuits 25 by virtue of corresponding through holes 28. The resin package 14 is formed in the frame 23 by injection molding so that the circuit board 26 is embedded and sealed. Furthermore, the electrode terminal 27 appears on the top surface of the frame 23.

Figure 14:
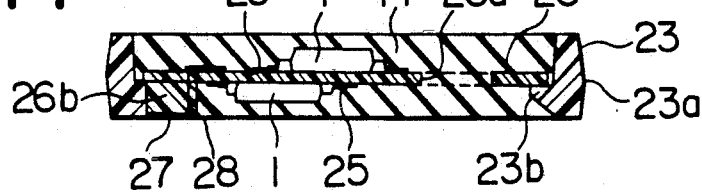
FIG. 14 is a cross sectional view which illustrates a IC card according to a tenth embodiment of the present invention.

FIG. 14 is a cross sectional view which illustrates an IC card according to a tenth embodiment of the present invention. According to this embodiment, a terminal electrode 27 appears on the lower side of the IC card in a contrary manner to the structure according to the IC card shown in FIG. 13.

Figure 15A:
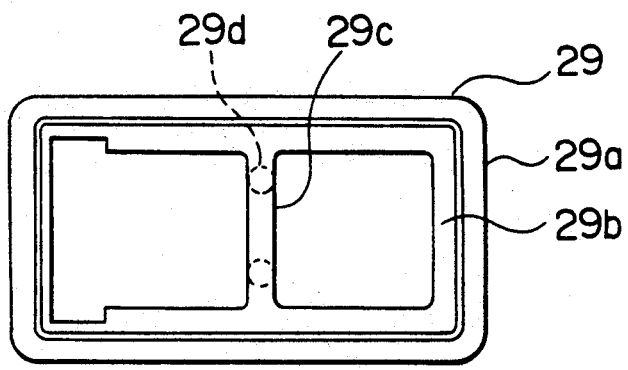
FIG. 15A is a plan view and FIG. 15B is a cross sectional view each of which illustrates a frame of an IC card according to an eleventh embodiment of the present invention.
Figure 15B:
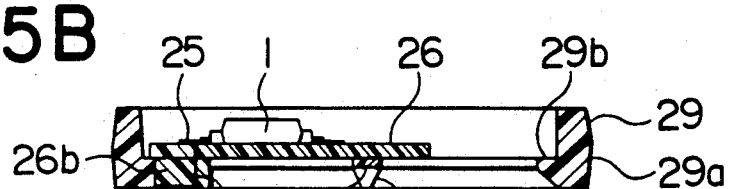

FIGS. 15A and 15B are a plan view and a front elevational cross sectional view which illustrate the frame of an IC card according to an eleventh embodiment of the present invention. According to this embodiment, the length of the circuit board is arranged to be short with respect to the inner length of the frame. A frame 29 made of synthetic resin has a board supporting portion 29b disposed inside a periphery portion 29a thereof. Furthermore, a sub-supporting portion 29c extending in the widthwise direction is formed intermediate of the length of the frame. A conical supporting portion 29d is integrally formed below the sub-supporting portion 29c, the conical supporting portion 29d having the front end portion of the conical shape which is positioned at the same level as the level of the lower surface of the periphery portion 29a. As a result, the area of the supporting portion 29d which appears on the outer surface of the completed IC card can be reduced. Thus, when the frame 29 in which the circuit board 26 is supported by the board supporting portion 29b is placed in the mold, an end portion of the circuit board 26 is supported by the sub-supporting portion 29c and the supporting portion 29d.

The resin injected into the frame 29 placed in the mold passes through a large gap formed between an end portion of the circuit board 26 and the board supporting portion 29b. Thus, the resin is introduced into the two sides of the circuit board 26, causing the IC card to be molded.

Figure 16A:
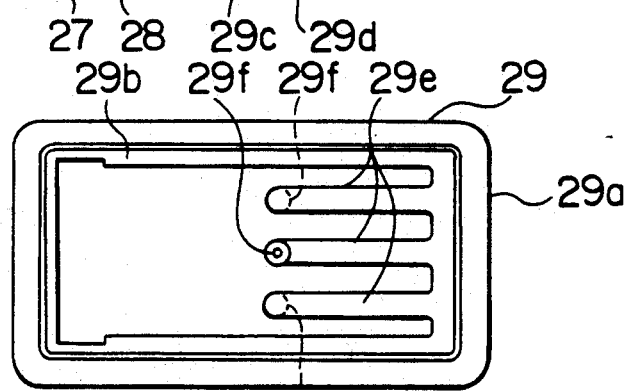
FIG. 16A is a plan view which illustrates a frame of an IC card according to a twelfth embodiment of the present invention and FIG. 16B is a cross sectional view which illustrates the completed IC card.
Figure 16B:
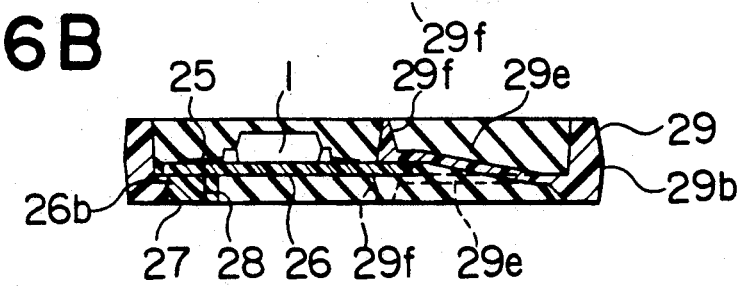

FIGS. 16A and 16B illustrate a twelfth embodiment of the present invention including a sub-supporting portion of the structure which is different from that of the sub-supporting portion 29c of the frame 29 shown in FIGS. 15A and 15B. FIGS. 16A and 16B are a plan view of the frame and a cross sectional view of the IC card, respectively. Referring to the drawings, the frame 29 has three sub-supporting portions 29e in an elongated shape formed therein from the board supporting portion 26b inside the periphery portion 29a toward the central portion thereof. Each of the three sub-supporting portions 29e has an integrally formed conical supporting portion 29f at the front end portion thereof. The central sub-supporting portion 29e of the three sub-supporting portions 29e has the supporting portion 29f disposed in the upper portion of the frame 29, while the other two sub-supporting portions 29e have the supporting portions 29f disposed in the lower portion of the frame 29. When the frame 29, in which the circuit board 26 is received by the board supporting portion 29b, is placed in the mold, each of the sub-supporting portions 29e and the supporting portion 29f hold an end portion of the circuit board 26 therebetween.

As shown in FIG. 16B, the height of each of the supporting portions 29f is arranged such that the function parts disposed on the board 26 do not appear in the resin package 14 and that the front end portion of each of the supporting portions 29f does not project over the outer surface of the resin package 14.

Figure 17A:
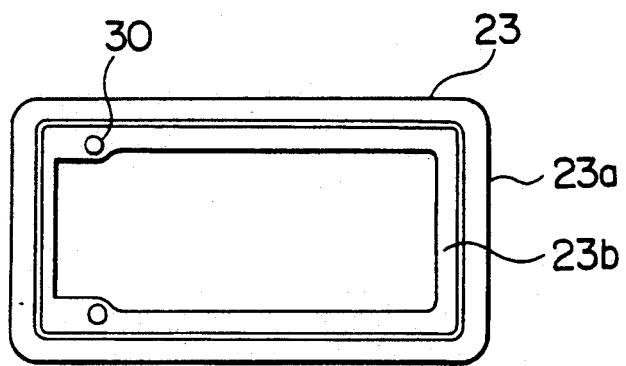
FIG. 17A is a plan view and FIG. 17B is a cross sectional view each of which illustrates a frame of an IC card according to a thirteenth embodiment of the present invention.
Figure 17B:
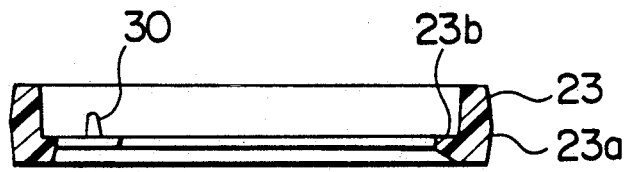

FIGS. 17A and 17B are a plan view and a front elevational cross sectional view which illustrate the frame according to a thirteenth embodiment of the present invention. The board supporting portion 23b formed inside the periphery portion 23a of the frame 23 has a pair of positioning pins 30 integrally formed on the two sides of the board supporting portion 23b. As a result, positioning holes (omitted from the illustration) formed in the circuit board 26 can be engaged to the above-described positioning pins 30. Therefore, the outline of the frame 23 and the circuit board 26 can be accurately positioned with respect to each other. The above-described accurate positional relationship is a critical factor when an IC card, the electrode terminal of which appears outside, is designed.

Figure 18:
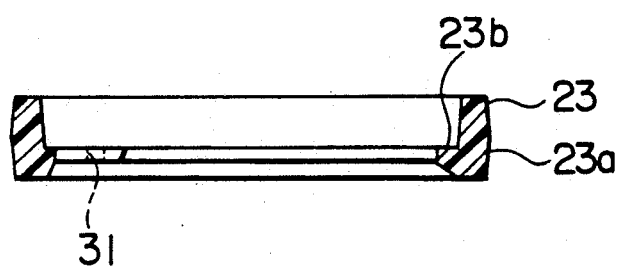
FIG. 18 is a cross sectional view which illustrates a frame of an IC card according to a fourteenth embodiment of the present invention.

FIG. 18 is a front elevational cross sectional view which illustrates a frame according to a fourteenth embodiment of the present invention. The board supporting portion 23b of the frame 23 has a pair of positioning holes 31 formed on the two sides of the board supporting portion 23b. As a result, positioning pins (omitted from the illustration) formed in the circuit board 26 can be engaged to the above-described positioning holes 31. Therefore, the outline of the frame 23 and the circuit board 26 can be accurately positioned with respect to each other.

According to the above-described embodiments, thermotropic liquid crystal polymer is employed as the synthetic resin to form the frame and also to be injected into the frame so as to integrally mold the resin package The present invention is not limited to the above-described description. For example, polycarbonate resin or polybutylene terephthalate (PBT) resin may be employed solely or in the form of a mixture with other components.

Although any thermal plastic and thermal setting synthetic resin which can be usually used for molding can be employed, it is preferable that heat resistant and thermal plastic synthetic resin be employed and the thus employed resin be injection-molded in order to easily mount the parts such as the ICs 1 and to improve the manufacturing yield.

Although the TPX resin exhibiting an excellent ultraviolet ray permeability is employed as the transparent resin, the present invention is not limited to the above-described description.

As described above, according to the present invention, the structure is arranged in such a manner that the circuit board is integrally formed at an intermediate position in the thickness direction of a frame made of the synthetic resin and inside the periphery of the frame. Furthermore, the circuit is formed on the circuit board and the function parts are mounted on the same, and then the synthetic resin is injected in the frame so that the IC card is formed. Therefore, a package in which the function part portion can be reliably hermetically sealed can be easily obtained. The package thus obtained exhibits satisfactory deformation resistance against external forces, excellent durability and reliability.

According to another aspect of the present invention, the board supporting portion is disposed at an intermediate position in the direction of the thickness of the frame made of the synthetic resin and on the inside of this frame. Furthermore, the circuit board, on which the circuit is formed and the electronic parts are mounted, is supported on the board supporting portion, and then the synthetic resin is injected in the frame so that the IC card is formed. Therefore, the package in which the function part portion can be reliably hermetically sealed can be easily obtained. The package thus obtained exhibits satisfactory deformation resistance against external force, excellent durability and reliability.

Although the present invention has been described in its preferred form, it is understood that the present disclosure of the preferred embodiments may be changed in construction or the combination and arrangement of parts may be changed without departing from the spirit and the scope of the present invention as hereinafter claimed.

What is claimed is:

1. A method of manufacturing an IC card comprising:
    injecting a synthetic resin into a mold so that a frame is formed, said frame integrally comprising a periphery having a thickness corresponding to the thickness of said IC card and a circuit board disposed intermediate the thickness of said frame and having opposed first and second surfaces and an opening penetrating from said first surface to said second surface;
    forming a circuit, electronic parts, and an I/O portion on at least one of said first and second surfaces of said circuit board; and filling said frame with synthetic resin in a mold passing through said opening to said first and second surfaces of said circuit board to hermetically seal said circuit, electronic parts, and I/O portion with a thickness no greater than the thickness of said frame;

2. A method of manufacturing an IC card comprising: injecting a synthetic resin into a mold so that a frame is formed, said frame integrally comprising a periphery having a thickness corresponding to the thickness of said IC card and a circuit board supporting portion disposed intermediate the thickness of said periphery within said frame;

forming a circuit, electronic parts, and an I/O portion on at least one of opposed first and second surfaces of said circuit board and an opening which penetrates from the first surface to the second surface; and filling said frame with synthetic resin in a mold with said synthetic resin passing through said opening to hermetically seal said circuit, electronic parts, and I/O portion with a thickness no greater than the thickness of said frame.

* * * * *